United States Patent
Vega et al.

(10) Patent No.: US 11,527,647 B2
(45) Date of Patent: Dec. 13, 2022

(54) FIELD EFFECT TRANSISTOR (FET) DEVICES

(71) Applicant: INTERNATIONAL BUSINESS MACHINES CORPORATION, Armonk, NY (US)

(72) Inventors: Reinaldo Vega, Mahopac, NY (US); Takashi Ando, Eastchester, NY (US); Cheng Chi, Jersey City, NJ (US); Praneet Adusumilli, Somerset, NJ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 29 days.

(21) Appl. No.: 17/139,053

(22) Filed: Dec. 31, 2020

(65) Prior Publication Data
US 2022/0209018 A1     Jun. 30, 2022

(51) Int. Cl.
  *H01L 29/78*     (2006.01)
  *H01L 27/092*    (2006.01)
  *H01L 29/06*     (2006.01)
  *H01L 29/66*     (2006.01)
  (Continued)

(52) U.S. Cl.
  CPC ......... *H01L 29/78391* (2014.09); *H01L 21/823828* (2013.01); *H01L 21/823871* (2013.01);
  (Continued)

(58) Field of Classification Search
  CPC ......... H01L 29/78648; H01L 29/78391; H01L 29/0653; H01L 29/6684; H01L 29/516; H01L 29/40111; H01L 27/0922; H01L 27/11585; H01L 27/11587; H01L 27/092; H01L 21/8238
  See application file for complete search history.

(56) References Cited

U.S. PATENT DOCUMENTS 6,326,651 B1 * 12/2001 Manabe ............ H01L 27/11803
                                                    257/295
6,943,633 B2     9/2005 Singh
                 (Continued)

FOREIGN PATENT DOCUMENTS

CN       111081761 A  *  4/2020

OTHER PUBLICATIONS

Anonymous, "Method and Structure for Fabricating Negative Capacitance Field Effect Transistor (NCFET) with Daisy Chained Ferroelectric/Dielectric Stacks and Complementary Logic with Shared Ferroelectric Capacitor", An IP.com Prior Art Database Technical Disclosure, Sep. 2019, 6 pages.

(Continued)

*Primary Examiner* — Jose R Diaz
(74) *Attorney, Agent, or Firm* — Tutunjian & Bitetto, P.C.; Samuel Waldbaum

(57) ABSTRACT

A field effect transistor (FET) device is provided. The device includes an isolation region on a support substrate that separates a first back gate from a second back gate, and a gate dielectric layer on a first channel region and a second channel region. The device further includes a conductive gate layer having a work function value and a ferroelectric layer on the gate dielectric layer, wherein the first back gate can adjust a threshold voltage for the first channel region, and the second back gate can adjust a threshold voltage for the second channel region.

20 Claims, 10 Drawing Sheets

(51) Int. Cl.
    *H01L 29/786*     (2006.01)
    *H01L 21/8238*     (2006.01)
    *H01L 27/12*     (2006.01)

(52) U.S. Cl.
    CPC .. *H01L 21/823878* (2013.01); *H01L 27/0922* (2013.01); *H01L 29/0653* (2013.01); *H01L 29/6684* (2013.01); *H01L 29/78648* (2013.01); *H01L 21/8238* (2013.01); *H01L 27/1203* (2013.01)

(56) References Cited

U.S. PATENT DOCUMENTS

| | | |
|---|---|---|
| 9,679,893 B2 | 6/2017 | Yan et al. |
| 2015/0021699 A1 | 1/2015 | Ando et al. |
| 2019/0131394 A1 | 5/2019 | Reznicek et al. |

OTHER PUBLICATIONS

Hu et al., "Negative Capacitance Enables FinFET and FDSOI Scaling to 2 nm Node", IEDM17, Dec. 2017, pp. 557-560.

Moura et al., "Multi-mode nanoFETs: From Low Power to High Performance on Demand". IOP Publishing Semiconductor Science and Technology, Apr. 2020, 12 pages.

Ota et al., "Perspective of Negative Capacitance FinFETs Investigated by Transient TCAD Simulation", IEDM17, Dec. 2017, pp. 361-364.

Saeidi et al., "Negative Capacitance as Digital and Analog Performance Booster for Complementary MOS Transistors", arXiv:1804.09622v2 [physics.app-ph] Apr. 27, 2018, pp. 1-18.

\* cited by examiner

FIELD EFFECT TRANSISTOR (FET) DEVICES

BACKGROUND

The present invention generally relates to field effect transistor (FET) devices, and more particularly to metal-ferroelectric-metal-insulator-semiconductor (MFMIS) negative capacitance field effect transistor devices on fully depleted silicon-on-insulator, (FD-SOI, FDSOI).

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) circuit, where a p-type MOSFET and n-type MOSFET are coupled together.

SUMMARY

In accordance with an embodiment of the present invention, a field effect transistor (FET) device is provided. The device includes an isolation region on a support substrate that separates a first back gate from a second back gate, and a gate dielectric layer on a first channel region and a second channel region. The device further includes a conductive gate layer having a work function value and a ferroelectric layer on the gate dielectric layer, wherein the first back gate can adjust a threshold voltage for the first channel region, and the second back gate can adjust a threshold voltage for the second channel region.

In accordance with another embodiment of the present invention, a complementary metal-oxide-semiconductor (CMOS) circuit is provided. The device includes a first dielectric layer between a support substrate and a first back gate, and a gate dielectric layer on a first channel region over the first back gate. The device further includes a first pair of source/drains on opposite sides of the first channel region, and a conductive gate layer having a work function value and a ferroelectric layer on the gate dielectric layer, wherein the first back gate can adjust a threshold voltage for the first channel region.

In accordance with yet another embodiment of the present invention, a method of fabricating a field effect transistor (FET) device is provided. The method includes forming a first back gate and a second back gate between a first dielectric layer and a second dielectric layer on a support substrate, and forming a first pair of source/drains on opposite sides of a first channel region, wherein the first channel region is above the first back gate. The method further includes forming a second pair of source/drains on opposite sides of a second channel region, wherein the second channel region is above the second back gate, and forming a gate dielectric layer on the first channel region and the second channel region. The method further includes forming a conductive gate layer having a work function value on the gate dielectric layer, and forming a ferroelectric layer on the conductive gate layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
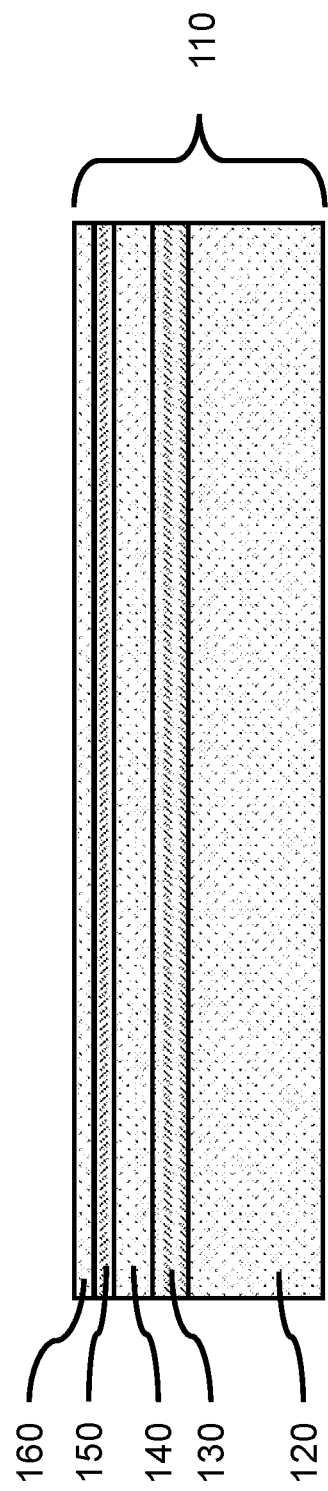
FIG. 1 is a cross-sectional side view showing a substrate having a first dielectric layer on a support substrate, a first semiconductor layer on the first dielectric layer, a second dielectric layer on the first semiconductor layer, and a second semiconductor layer on the second dielectric layer, in accordance with an embodiment of the present invention.

Embodiments of the present invention provide FDSOI MFMIS NCFETs with separate NFET and PFET back gates, in addition to a shared internal metal gate (IMG) between an NFET and PFET, where the FETs include a metal-ferroelectric-metal-insulator-semiconductor (MFMIS) gate structure. Separate NFET/PFET back gates can be used to individually tune each of the NFET and PFET threshold voltages, $V_{tN}$ and $V_{tP}$, across a $V_t$ menu.

The lowest $V_t$ pair can provide the best complementary capacitance matching with the steepest SS. The present approach can leverage parallel complementary FET capacitance to achieve improved $C_{gate}$-to-$C_{FE}$ matching across the full Vin sweep range. A back gate can be used to individually tune NFET and PFET $V_t$ to achieve low $V_t$ pair. This can provide improved subthreshold swing compared to a stand-alone NCFET (non-complementary FET) with the same dielectric stack. Use of a back-gated structure to freely modulate $V_t$ can tune complementary capacitance matching, and provide a low $V_t$ NFET/PFET pair. Complementary capacitance matching can improve the subthreshold swing in NCFET CMOS. Use of a pair of back gates to individually tune both NFET and PFET threshold voltages, $V_t$, can achieve a low $V_t$ pair. The lower the $V_t$ pair, the steeper the subthreshold swing. The lowest $V_t$ pair can have the steepest subthreshold swing.

In various embodiments, the use of complementary $C_{inv}$ can achieve capacitance matching in an off-state with a shared ferroelectric (FE) layer between complementary devices.

Negative capacitance in ferroelectrics arises from the imperfect screening of the spontaneous polarization. The physical separation of ferroelectric bound charges from the metallic screening charges creates a depolarizing field inside the ferroelectric and destabilizes the polarization. The negative capacitance, originating from the dynamics of the stored energy in the phase transition of ferroelectric materials, results in an internal voltage amplification in an MOS device when integrated into the gate stack.

Exemplary applications/uses to which the present invention can be applied include, but are not limited to: logic devices and memory devices using CMOS circuits.

In n-channel enhancement-mode devices, a conductive channel does not exist naturally within the transistor, and a positive gate-to-source voltage is necessary to create one. In fully depleted silicon-on-insulator (FDSOI) devices, the channel region is sufficiently thin so that the depletion region covers the whole channel thickness. A depletion region is an insulating region within a conductive, doped semiconductor material where the mobile charge carriers have migrated away under an electric field. It is formed from a conducting region by removal of all free charge carriers, leaving none to carry a current. An N-type semiconductor has an excess of free electrons (in the conduction band) compared to the P-type semiconductor, and the P-type semiconductor has an excess of holes (in the valence band) compared to the N-type. The majority charge carriers (free electrons for the N-type semiconductor, and holes for the P-type semiconductor) become depleted in the depletion region.

The power consumption of a CMOS integrated circuit includes static power consumption and dynamic power consumption, where static power consumption is the power used when the transistor is not in the process of switching, which includes leakage current, and dynamic power consumption includes the amount of power consumed when the device changes logic states, i.e. "switches," and the power used to charge a load capacitance.

If a positive voltage is applied to the gate of a field effect transistor, the positively charged holes in the semiconductor nearest the gate are repelled by the electric field generated by the positive charge on the gate. The repelled charge carriers leave behind a depleted region that is insulating because no mobile positive charge carriers remain in the channel region.

A polarization destabilization in ferroelectrics causes an effective negative permittivity, resulting in a differential voltage amplification and a reduced subthreshold swing when integrated into the gate stack of a transistor. The gate stack is no longer a passive part of a transistor, but contributes to signal amplification. As a result of the subthreshold swing reduction, the required supply voltage to provide the same on-current is reduced.

The minimum subthreshold swing of a conventional device is $$S_{s-th,min} = \ln(10)\frac{kT}{q},$$

which is referred to as the thermionic limit, which is 60 mV/dec for drain-to-source current at 300 K.

The subthreshold slope is given by:

$$S_{s-th,min} = \ln(10)\frac{kT}{q}\left(1 + \frac{C_d}{C_{ox}}\right),$$

where Cd is the depletion layer capacitance and $C_{ox}$ is the gate oxide capacitance.

$$\frac{kT}{q}$$

is the thermal voltage.

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, is a cross-sectional side view of a substrate having a first dielectric layer on a support substrate, a first semiconductor layer on the first dielectric layer, a second dielectric layer on the first semiconductor layer, and a second semiconductor layer on the second dielectric layer is shown, in accordance with an embodiment of the present invention.

In one or more embodiments, a substrate 110 can include a first dielectric layer 130 on a support substrate 120, a first semiconductor layer 140 on the first dielectric layer 130, a second dielectric layer 150 on the first semiconductor layer 140, and a second semiconductor layer 160 on the second dielectric layer 150. The support substrate 120 can provide structural integrity for the other layers. In various embodiments, the substrate 110 can be a fully depleted silicon-on-insulator (FDSOI) substrate, where at least one of the dielectric layers is ultra-thin and at least one of the semiconductor layers is ultra-thin.

In various embodiments, the support substrate 120 can be a semiconductor material, including, but not limited to, a type IV semiconductor, for example, silicon (Si) and germanium (Ge), a IV-IV compound semiconductor, for example, silicon-germanium (SiGe) and silicon carbide (SiC), a III-V compound semiconductor, for example, gallium arsenide (GaAs), gallium nitride (GaN), indium phosphide (InP), III-V compound semiconductor, for example, cadmium selenide (CdSe) and zinc sulfide (ZnS), and combinations thereof. In various embodiments, the support substrate 110 can be an electrically insulating dielectric material, for example, silicon oxide (SiO), silicon nitride (SiN), aluminum oxide (AlO), or combinations thereof.

In various embodiments, the first dielectric layer 130 can be a buried insulator layer, for example, a buried oxide layer (i.e., BOX layer), which may be silicon oxide (SiO) formed on or in the support substrate 120.

In various embodiments, the first dielectric layer 130 can be made of an insulating dielectric material, including, but not limited to, silicon oxide (SiO), silicon nitride (SiN), silicon oxynitride SiON), high-k dielectric materials having a dielectric constant greater than silicon dioxide ($SiO_2$), low-k dielectric material (e.g., carbon doped silicon oxide (SiO:C)) having a dielectric constant less than silicon dioxide ($SiO_2$), and combinations thereof.

In various embodiments, a first semiconductor layer 140 can be on the first dielectric layer 130. In various embodiments, the first semiconductor layer 140 and first dielectric layer 130 can be formed on the support substrate 120 for example, by a Smart Cut® process, or the first dielectric layer 130 can be formed in a substrate through a SIMOX® process.

In one or more embodiments, the second dielectric layer 150 can be formed on the first semiconductor layer 140, and the second semiconductor layer 160 can be formed on the second dielectric layer 150, for example, by a Smart Cut® process.

In various embodiments, the first semiconductor layer 140 and/or second semiconductor layer 160 can each be a semiconductor material, including, but not limited to, a type IV semiconductor, for example, silicon (Si) and germanium (Ge), a IV-IV compound semiconductor, for example, silicon-germanium (SiGe) and silicon carbide (SiC), a III-V compound semiconductor, for example, gallium arsenide (GaAs), gallium nitride (GaN), indium phosphide (InP), III-V compound semiconductor, for example, cadmium selenide (CdSe) and zinc sulfide (ZnS), and combinations thereof.

In various embodiments, the second dielectric layer 150 can be made of an insulating dielectric material, including, but not limited to, silicon oxide (SiO), silicon nitride (SiN), silicon oxynitride SiON), high-k dielectric materials having a dielectric constant greater than silicon dioxide ($SiO_2$), low-k dielectric material (e.g., carbon doped silicon oxide (SiO:C)) having a dielectric constant less than silicon dioxide ($SiO_2$), and combinations thereof.

Figure 2:
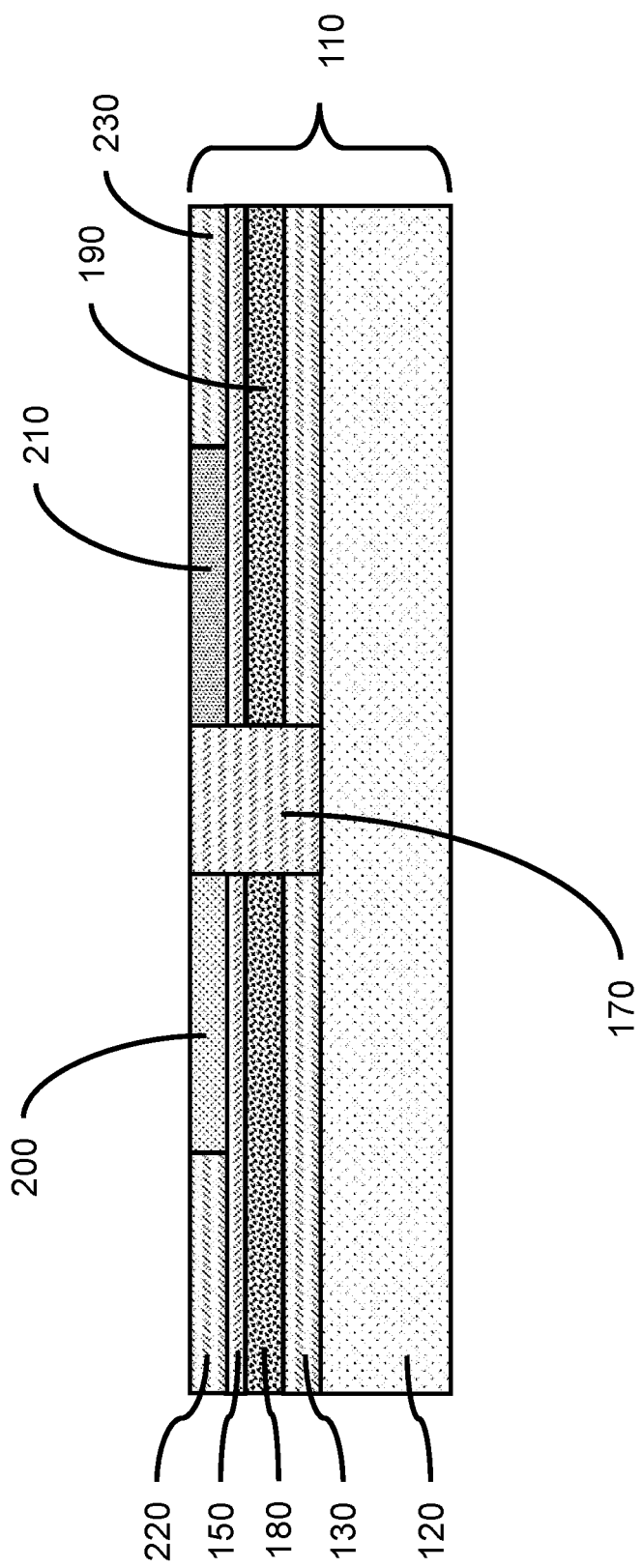
FIG. 2 is a cross-sectional side view showing a pair of back gates formed on the first dielectric layer, and a pair of source/drains formed on the second dielectric layer, in accordance with an embodiment of the present invention.

FIG. 2 is a cross-sectional side view showing a pair of back gates formed on the first dielectric layer, and a pair of source/drains formed on the second dielectric layer, in accordance with an embodiment of the present invention.

In various embodiments, an isolation region 170 can be formed in the substrate 110, where the isolation region 170 can be formed through the first dielectric layer 130, first semiconductor layer 140, second dielectric layer 150, and second semiconductor layer 160. The isolation region 170 can be formed by forming a trench through the first dielectric layer 130, first semiconductor layer 140, second dielectric layer 150, and second semiconductor layer 160, and filling the trench with an electrically insulating, dielectric material.

In various embodiments, the isolation region 170 can be made of an insulating dielectric material, including, but not limited to, silicon oxide (SiO), silicon nitride (SiN), silicon oxynitride SiON), high-k dielectric materials having a dielectric constant greater than silicon dioxide ($SiO_2$), low-k dielectric material (e.g., carbon doped silicon oxide (SiO:C)) having a dielectric constant less than silicon dioxide ($SiO_2$), and combinations thereof.

In various embodiments, a first back gate 180 can be formed between the first dielectric layer 130 and the second dielectric layer 150, where the first back gate 180 can be formed by removing a portion of the first semiconductor layer 140, for example, by a selective etch (e.g., wet chemical etch, dry plasma etch). A metal can be deposited in the cavity formed by removal of the portion of the first semiconductor layer 140, or a doped semiconductor layer (n-type or p-type) can be formed by an epitaxial processes using remaining portions of the first semiconductor layer 140 for epitaxial growth surfaces.

In various embodiments, a second back gate 190 can be formed between the first dielectric layer 130 and the second dielectric layer 150, where the second back gate 190 can be formed by removing a portion of the first semiconductor layer 140. The second back gate 190 can be formed on a side of the isolation region 170 opposite the first back gate 180, where the isolation region 170 physically and electrically separates the second back gate 190 from the first back gate 180.

In various embodiments, the first back gate 180 and second back gate 190 can be metal conductors, for example, tungsten (W), tantalum (Ta), molybdenum (Mo), titanium aluminum (TiAl), conductive metal compounds, for example, titanium nitride (TiN), or a combination thereof. The first back gate 180 and second back gate 190 can be formed by metal-organic chemical vapor deposition (MOCVD), atomic layer deposition (ALD), plasma enhanced ALD (PEALD), low pressure CVD (LPCVD), and combinations thereof.

In various embodiments, the first back gate 180 and second back gate 190 can be a semiconductor that is suitably doped to be conductive, where the dopant can be an n-type dopant (e.g., phosphorus (P) or arsenic (As), or a p-type dopant, for example boron (B) or indium (In). In various embodiments having a doped semiconductor as the back gates 180, 190, the first dielectric layer 130 can be replaced with a suitably counter-doped well.

In one or more embodiments, a first doped semiconductor region 200 can be formed on the second dielectric layer 150, where the first doped semiconductor region 200 can be formed by doped epitaxy on the second semiconductor layer 160 and/or dopant implantation of the second semiconductor layer 160 or epitaxial layer on the second semiconductor layer 160. In various embodiments, the first doped semiconductor region 200 can be formed in situ or ex situ. In various embodiments, the first doped semiconductor region 200 can be n-doped to form an n-type field effect transistor device, for example, and NFET.

In one or more embodiments, a second doped semiconductor region 210 can be formed on the second dielectric layer 150, where the second doped semiconductor region 210 can be formed by doped epitaxy on the second semiconductor layer 160 and/or dopant implantation of the second semiconductor layer 160 or epitaxial layer on the second semiconductor layer 160. In various embodiments, the second doped semiconductor region 210 can be formed in situ or ex situ.

In various embodiments, the first doped semiconductor region 200 and second doped semiconductor region 210 can be a semiconductor material, including, but not limited to, a type IV semiconductor, for example, silicon (Si) and germanium (Ge), a IV-IV compound semiconductor, for example, silicon-germanium (SiGe) and silicon carbide (SiC), a III-V compound semiconductor, for example, gallium arsenide (GaAs), gallium nitride (GaN), indium phosphide (InP), III-V compound semiconductor, for example, cadmium selenide (CdSe) and zinc sulfide (ZnS), and combinations thereof. In various embodiments, the second doped semiconductor region 210 can be p-doped to form an p-type field effect transistor device, for example, and NFET. An n-type and a p-type field effect transistor can be electrically coupled to form a CMOS circuit.

In various embodiments, a first dielectric slab 220 and second dielectric slab 230 can be formed on the second dielectric layer 150 to electrically isolate the first doped semiconductor region 200 and second doped semiconductor region 210 from other layers and other components of the field effect transistor devices.

Figure 3:
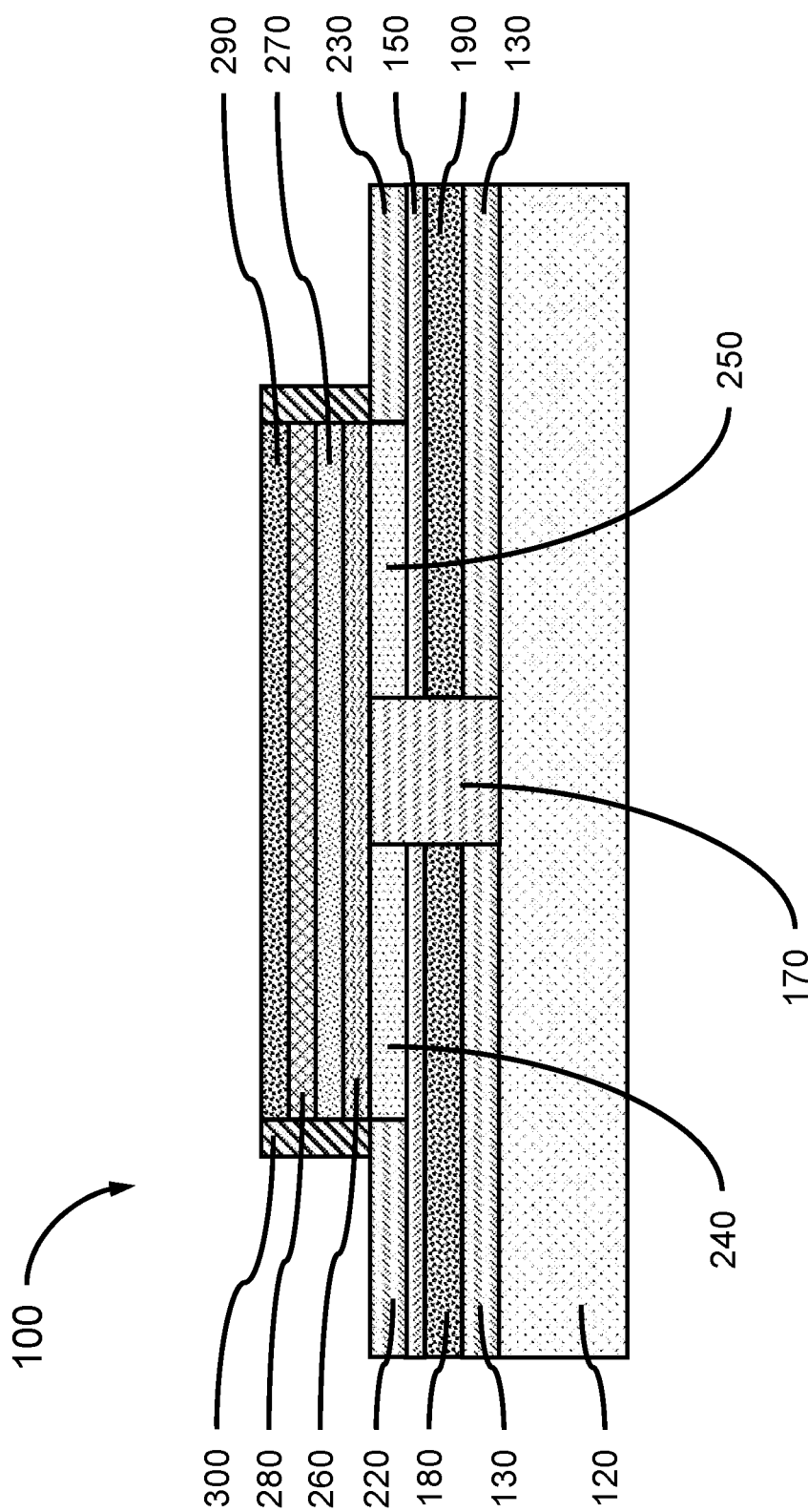
FIG. 3 is a cross-sectional side view showing a complementary metal-oxide-semiconductor (CMOS) circuit including an NFET metal-ferroelectric-metal-insulator-semiconductor (MFMIS) negative capacitance field effect transistor device and a PFET metal-ferroelectric-metal-insulator-semiconductor (MFMIS) negative capacitance field effect transistor device, in accordance with an embodiment of the present invention.

FIG. 3 is a cross-sectional side view showing a complementary metal-oxide-semiconductor (CMOS) circuit including an NFET metal-ferroelectric-metal-insulator-semiconductor (MFMIS) negative capacitance field effect transistor device and a PFET metal-ferroelectric-metal-insulator-semiconductor (MFMIS) negative capacitance field effect transistor device, in accordance with an embodiment of the present invention.

In one or more embodiments, a complementary metal-oxide-semiconductor (CMOS) circuit 100 can be formed on a support substrate 120 of the substrate 110, where the CMOS circuit can include an n-type field effect transistor (NFET) device and a p-type field effect transistor (PFET) device. The n-type field effect transistor (NFET) device can be a negative capacitance field effect transistor (NCFET) device, and the p-type field effect transistor (PFET) device can be a negative capacitance field effect transistor (NCFET) device. In various embodiments, the NFET can be a metal-ferroelectric-metal-insulator-semiconductor (MFMIS) negative capacitance field effect transistor device, and the PFET can be a metal-ferroelectric-metal-insulator-semiconductor (MFMIS) negative capacitance field effect transistor device. The NFET and the PFET can be on a fully depleted silicon-on-insulator (FD-SOI, FDSOI) substrate.

In various embodiments, the substrate 110 can be a fully depleted silicon-on-insulator (FD-SOI, FDSOI) substrate having a first dielectric layer 130 that may be a buried insulator layer, for example, a buried oxide layer (i.e., BOX layer) on the support substrate 120, with a first back gate 180 and a second back gate 190 on the first dielectric layer 130. A second dielectric layer 150 can be over the first back gate 180 and second back gate 190, where the first dielectric layer 130 electrically insulates the first back gate 180 and second back gate 190 from the support substrate 120, and the second dielectric layer 150 electrically insulates the first back gate 180 and second back gate 190 from an overlying first channel region 240 and/or second channel region 250.

In various embodiments, the first back gate 180 can form a back-gate of a field effect transistor formed on a first region of the substrate 110, and the second back gate 190 can form a back-gate of a field effect transistor formed on a second region of the substrate 110. In various embodiments, the field effect transistor formed on the first region can be an NFET and the field effect transistor formed on the second region can be a PFET.

In various embodiments, the second dielectric layer 150 can electrically insulate the source/drains, gate structure, and channel region of a field effect transistor device from the underlying back-gate 180, 190. The second dielectric layer 150 may be an original layer of the substrate 110 or may be formed by a conformal deposition, for example, atomic layer deposition (ALD), plasma enhanced ALD (PEALD), low pressure chemical vapor deposition (LPCVD), and combinations thereof. In various embodiments, the second dielectric layer 150 can be formed by wafer bonding, for example, by a Smart Cut® process.

In various embodiments, a first channel region 240 can be a portion of the second semiconductor layer 160 on the second dielectric layer 150. In various embodiments, a first channel region 240 can be on the second dielectric layer 150, where the first channel region 240 can be formed from the second semiconductor layer 160 on the second dielectric layer 150. The first channel region 240 may be formed by an epitaxial growth process on the second semiconductor layer 160.

In various embodiments, a second channel region 250 can be a portion of second semiconductor layer 160 on the second dielectric layer 150. In various embodiments, a second channel region 250 can be on the second dielectric layer 150, where the second channel region 250 can be formed from the second semiconductor layer 160 on the second dielectric layer 150. The second channel region 250 may be formed by an epitaxial growth process on the second semiconductor layer 160.

In various embodiments, the first channel region 240 and second channel region 250 can be a semiconductor material, including, but not limited to, a type IV semiconductor, for example, silicon (Si) and germanium (Ge), a IV-IV compound semiconductor, for example, silicon-germanium (SiGe) and silicon carbide (SiC), a III-V compound semiconductor, for example, gallium arsenide (GaAs), gallium nitride (GaN), indium phosphide (InP), III-V compound semiconductor, for example, cadmium selenide (CdSe) and zinc sulfide (ZnS), and combinations thereof.

In various embodiments, the second dielectric layer 150 can have a thickness in a range of about 2 nanometers (nm) to about 20 nm, or about 2 nm to about 10 nm, or about 3 nm to about 5 nm, although other thicknesses are also contemplated. The thickness of the second dielectric layer 150 can be sufficient to prevent leakage current between a back-gate 180, 190 and the device source/drains 200, 210 and/or channel regions 240, 250, while also providing enough voltage sensitivity to tune the threshold voltage, $V_t$, of the overlying NFET or PFET device with the power supply voltage(s) available to the integrated circuit (IC) chip.

In various embodiments, a first dielectric slab 220 and second dielectric slab 230 can be formed on the second dielectric layer 150 and electrically isolate the first channel region 240 and second channel region 250 from other layers and other components of the field effect transistor devices.

In various embodiments, the first dielectric slab 220 and the second dielectric slab 230 can each be made of an insulating dielectric material, including, but not limited to, silicon oxide (SiO), silicon nitride (SiN), silicon oxynitride (SiON), high-k dielectric materials having a dielectric constant greater than silicon dioxide ($SiO_2$), low-k dielectric material (e.g., carbon doped silicon oxide (SiO:C)) having a dielectric constant less than silicon dioxide ($SiO_2$), and combinations thereof. The first dielectric slab 220 and the second dielectric slab 230 can be the same dielectric material as the second dielectric layer 150, or can be different dielectric materials to allow selective etching.

In one or more embodiments, an isolation region 170 can be formed on the support substrate 120 of the substrate 110, where the isolation region 170 can physically and electrically separate the first back gate 180 from the second back gate 190, and physically and electrically separate the first channel region 240 from the second channel region 250. The isolation region 170 can be formed through the second dielectric layer 150, back gates 180, 190, and first dielectric layer 130, to the surface of the support substrate 120. In various embodiments, the isolation region 170 can be a shallow trench isolation region.

In one or more embodiments, a gate dielectric layer 260 can be formed on the source/drains 200, 210 and channel regions 240, 250 for an NFET and a PFET. The gate dielectric layer 260 can be formed across a top surface of the isolation region 170, where the gate dielectric layer 260 assists in electrically isolating the source/drain 200 (e.g., n-doped source/drain) from the source/drain 200 (e.g., p-doped source/drain). The gate dielectric layer 260 can be formed by a conformal deposition, for example, atomic layer deposition (ALD), plasma enhanced ALD (PEALD), or low pressure CVD (LPCVD).

In various embodiments, the gate dielectric layer 260 can be made of an insulating dielectric material, including, but not limited to, silicon oxide (SiO), silicon nitride (SiN), silicon oxynitride SiON), high-k dielectric materials, and combinations thereof. In various embodiments, the high-k dielectric can include, metal oxides, for example, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof. In various embodiments, the gate dielectric layer 260 can include multiple layers of dielectric material(s), for example, silicon dioxide ($SiO_2$) on hafnium dioxide ($HfO_2$).

In various embodiments, the gate dielectric layer 260 can have a thickness in a range of about 1 nm to about 3 nm, or about 2 nm, although other thicknesses are also contemplated.

In one or more embodiments, a conductive gate layer 270 can be formed on the gate dielectric layer 260, where the conductive gate layer 270 can be a work function material that can be metal, for example, titanium (Ti), tantalum (Ta), tungsten (W), cobalt (Co), molybdenum (Mo), titanium aluminum (TiAl), a metal compound, for example, titanium nitride (TiN), titanium carbide (TiC), tantalum nitride (TaN), tantalum carbide (TaC), tungsten nitride (WN), titanium aluminum nitride (TiAlN), and combinations thereof. The conductive gate layer 270 can be formed by metal-organic chemical vapor deposition (MOCVD), atomic layer deposition (ALD), plasma enhance ALD (PEALD), and combinations thereof.

In various embodiments, the lowest $V_t$ devices could have an NFET work function of about 4.3 to about 4.4 eV and a PFET work function of about 4.8 to about 4.9 eV. In various embodiments, the conductive gate layer 270 can have a work function in a range of about 4.3 to about 4.9 eV, which can function as a shared internal metal gate (IMG) for both the NFET and PFET. In various embodiments, the $V_t$ tuning from the back gates 180, 190 could cover the same range by using an applied voltage to get an appropriate $V_t$ for either the NFET or PFET or both.

In one or more embodiments, the same conductive gate layer 270 is used for both the NFET and PFET, resulting in a higher threshold voltage for one or both of the gate(s) of the NFET and/or PFET. Selecting a material for the conductive gate layer 270 that provides an intermediate work function value for both NFET and PFET gates can reduce the complementary capacitance matching between the gates and the ferroelectric layer 280. The first back gate 180 and second back gate 190 can function as separate back gates for the NFET and PFET to provide individual tuning of the threshold voltages, $V_t$, of the NFET and PFET. This can provide complementary capacitance matching, while also providing the steepest subthreshold swing.

In a non-limiting exemplary embodiment, the shared IMG can have a midgap work function of about 4.6 eV, which would result in both the NFET and PFET $V_t$ being tuned (e.g., reduced) by about 0.3 V to achieve the intended threshold voltage. In another non-limiting exemplary embodiment, the shared IMG could have a work function at one end of an intended range (e.g., 4.3 eV for the NFET work function metal, or a 4.9 eV for the PFET work function metal) and the complementary FET would then have the threshold voltage, $V_t$, tuned/reduced by about 0.6 V (e.g., if the shared IMG has a predetermined work function of 4.9 eV, then the threshold voltage, $V_t$, for the PFET remains unchanged, and the threshold voltage, $V_t$, for the NFET is adjusted by ~0.6 V).

In various embodiments, the conductive gate layer 270 can have a thickness in a range of about 1 nm to about 10 nm, or about 3 nm to about 5 nm, although other thicknesses are also contemplated. The thickness of the conductive gate layer 270 can be sufficient to form a continuous layer while minimizing capacitances.

In one or more embodiments, a ferroelectric (FE) layer 280 can be formed on the conductive gate layer 270, where the ferroelectric layer 280 can be formed by physical vapor deposition (PVD), chemical vapor deposition (CVD), plasma enhanced CVD (PECVD), and combinations thereof.

In various embodiments, the ferroelectric layer 280 can be a ferroelectric material, including, but not limited to, hafnium oxide (HfO), zirconium oxide (ZrO), hafnium zirconium oxide (HZO), hafnium silicon oxide ($HfSiO_x$), barium titanate (BaTiO), potassium niobate (KNbO), bismuth titanate (BiTiO), and combinations thereof. The ferroelectric layer 280 provides a layer with a negative capacitance before the gate electrode formed by the conductive gate layer 270, where the negative capacitance can improve the subthreshold slope and ratio of the On current to the Off current, ($I_{on}/I_{off}$). This can reduce leakage current in the subthreshold region of the device(s).

In one or more embodiments, a conductive gate electrode layer 290 can be formed on the ferroelectric layer 280, where the conductive gate electrode layer 290 can be a metal, for example, titanium (Ti), tantalum (Ta), tungsten (W), cobalt (Co), molybdenum (Mo), titanium aluminum (TiAl), a metal compound, for example, titanium nitride (TiN), titanium carbide (TiC), tantalum nitride (TaN), tantalum carbide (TaC), tungsten nitride (WN), titanium aluminum nitride (TiAlN), and combinations thereof.

In various embodiments, the conductive gate electrode layer 290 can be formed by metal-organic chemical vapor deposition (MOCVD), atomic layer deposition (ALD), plasma enhanced ALD (PEALD), low pressure CVD (LPCVD), and combinations thereof. The conductive gate electrode layer 290 can have multiple conductive layers of different metals and/or metal compounds.

In one or more embodiments, a gate structure can include a metal 290/ferroelectric 280/metal 270/dielectric 260 series stack, where the gate structure is on both an NFET and a PFET of a CMOS circuit. The gate structure can be above the first channel region 240 and the second channel region 250 and span the isolation region 170 to form a shared gate structure. The combination of gate structure layers can provide a negative capacitance gate structure, and the shared gate structure can provide suitable capacitance matching.

In various embodiments, gate sidewall spacer 300 can be formed on the conductive gate electrode layer 290 and surround the gate structure of the NFET and PFET. In various embodiments, the gate sidewall spacer 300 can be formed by a conformal deposition (e.g., ALD, PEALD) and etched back using a selective directional etch and/or chemical/mechanical polishing (CMP). The gate sidewall spacer 300 can be a dielectric material, for example, silicon nitride (SiN) or silicon oxynitride (SiON), silicon boro carbonitride (SiBCN), and combinations thereof.

Figure 4:
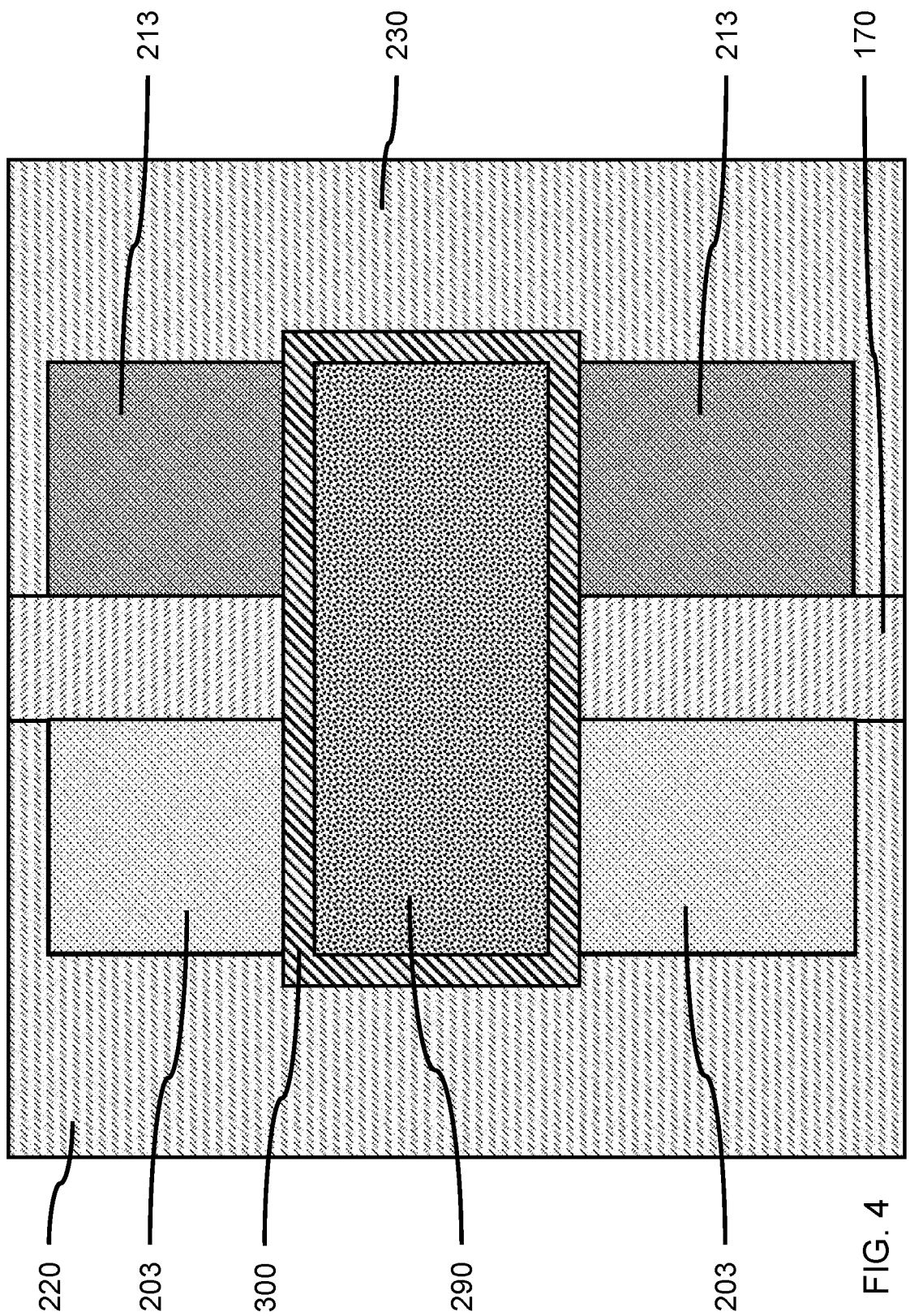
FIG. 4 is a top view showing a layout of the source/drains and gate structure for the NFET negative capacitance field effect transistor device and the PFET negative capacitance field effect transistor device, in accordance with an embodiment of the present invention.

FIG. 4 is a top view showing a layout of the source/drains and gate structure for the NFET negative capacitance field effect transistor device and the PFET negative capacitance field effect transistor device, in accordance with an embodiment of the present invention.

In various embodiments, the first doped semiconductor region 200 can form first source/drains 203 on opposite sides of the first channel region 240, and second doped semiconductor region 210 can form second source/drains 213 on opposite sides of the second channel region 250, where the source/drains 203, 213 and channel regions 240, 250 can be adjacent to and aligned parallel with the isolation region 170. In various embodiments, first source/drains 203 can be n-type source/drains and second source/drains 213 can be p-type source/drains to form an NFET and PFET, respectively. The first dielectric slab 220 can be adjacent to the first source/drains 203, and second dielectric slab 230 can be adjacent to the second source/drains 213. The gate sidewall spacer 300 can be on the first and second dielectric slabs 220, 230 and the isolation region 170.

In various embodiments, the gate structure including the conductive gate electrode layer 290 and gate sidewall spacer 300 can extend over the channel regions 240, 250 and across the isolation region 170.

Figure 5:
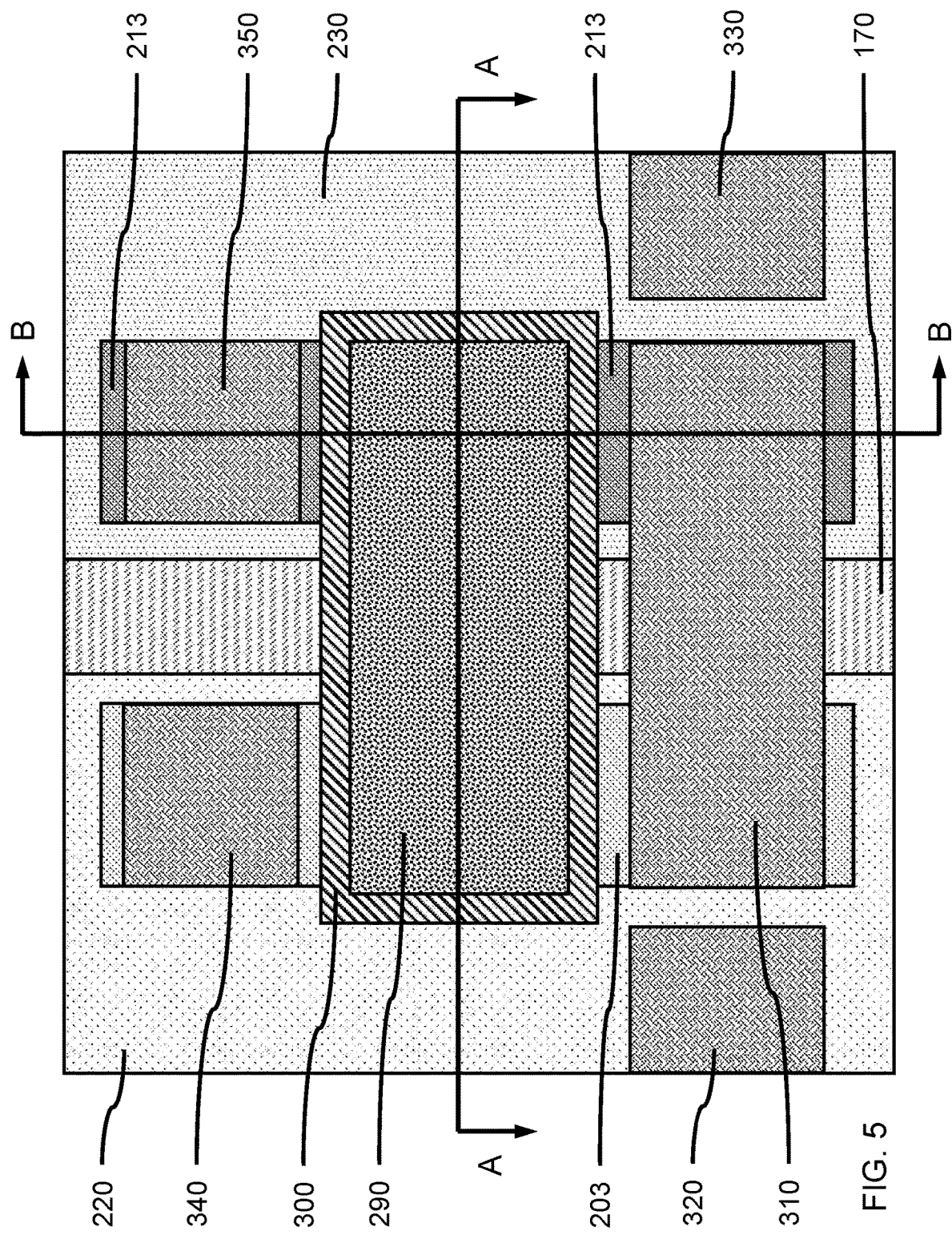
FIG. 5 is a top view showing electrical contacts formed to the source/drains and gate structure, in accordance with an embodiment of the present invention.

FIG. 5 is a top view showing electrical contacts formed to the source/drains and gate structure, in accordance with an embodiment of the present invention.

In various embodiments, a bridging contact 310 can be formed between one of the first source/drains 203 and one of the second source/drains 213, where the first source/drain 203 and second source/drain 213 can be on the same side of the gate structure. The bridging contact 310 can be a conductive metal, for example, tungsten (W).

In various embodiments, a first back gate contact 320 can be formed to the first back gate 180. The first back gate contact 320 can be configured to supply a voltage to the first back gate 180.

In various embodiments, a second back gate contact 330 can be formed to the second back gate 190. The second back gate contact 330 can be configured to supply a voltage to the second back gate 190.

In various embodiments, a first source/drain contact 340 can be formed to the other one of the first source/drains 203, and a second source/drain contact 350 can be formed to the other one of the second source/drains 213.

In various embodiments, a gate contact can be formed to the gate structure.

The arrangement of electrical contacts can be configured to form a complementary metal-oxide-semiconductor (CMOS) circuit including an NFET metal-ferroelectric-metal-insulator-semiconductor (MFMIS) negative capacitance field effect transistor device and a PFET metal-ferroelectric-metal-insulator-semiconductor (MFMIS) negative capacitance field effect transistor device.

Figure 6:
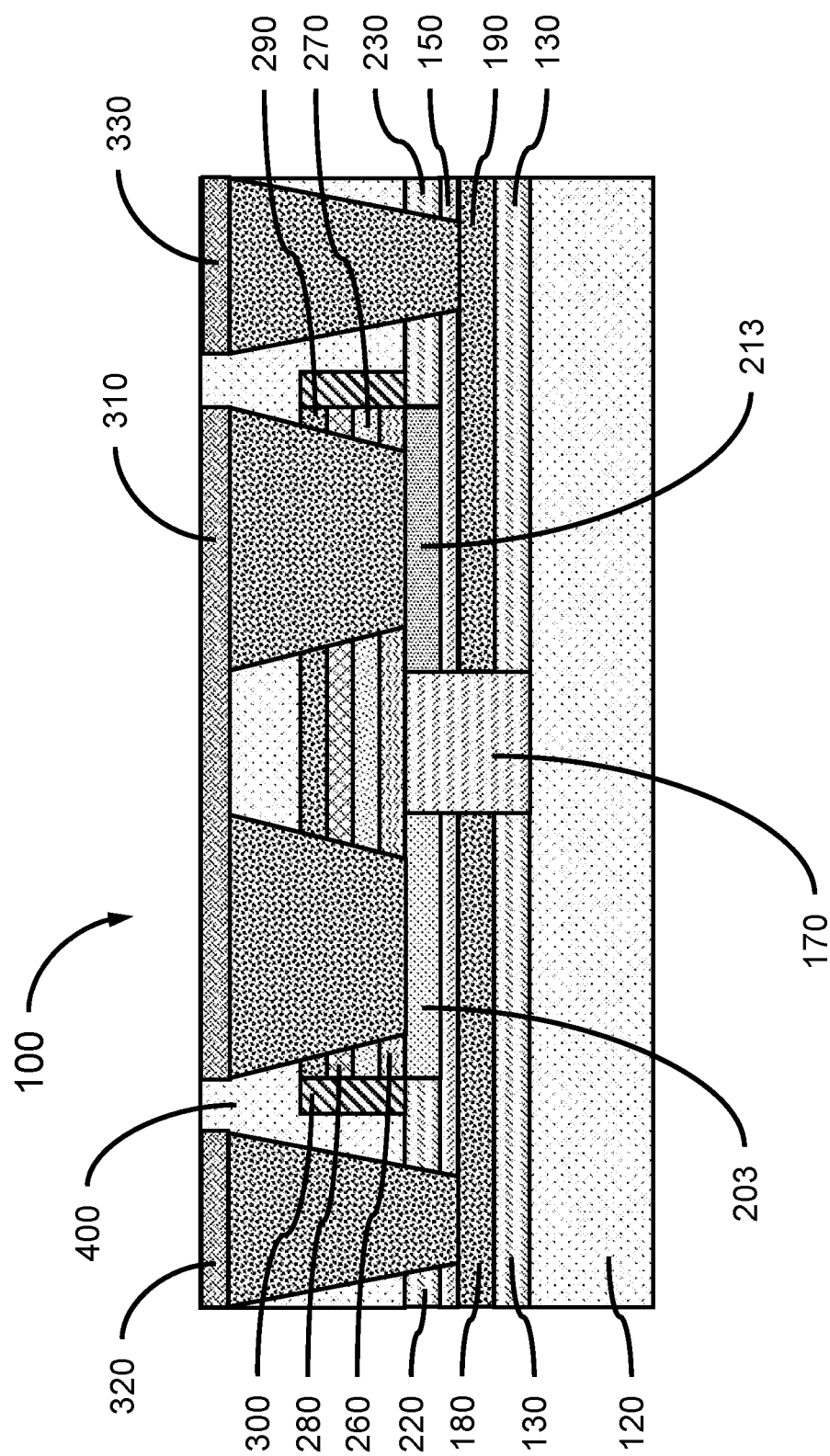
FIG. 6 is a partial cut-away view illustrating a side of the complementary metal-oxide-semiconductor (CMOS) circuit with source/drain and back gate contacts, in accordance with an embodiment of the present invention.

FIG. 6 is a partial cut-away view illustrating a side of the complementary metal-oxide-semiconductor (CMOS) circuit with source/drain and back gate contacts, in accordance with an embodiment of the present invention.

In various embodiments, the bridging contact 310, first back gate contact 320, second back gate contact 330, first source/drain contact 340, second source/drain contact 350, and gate contact can include a via in electrical contact with the corresponding component of the FET devices, and a conductive line in electrical contact with the via. In FIG. 6 the bridging contact 310 is shown in front of the gate structure.

In various embodiments, the first dielectric layer 130 and second dielectric layer 150 with the isolation region 170 can encapsulate the first back gate 180 to form a buried back gate below n-type source/drains 203.

In various embodiments, the first back gate contact 320 and the second back gate contact 330 can each be a conductive material, including, but not limited to, copper (Cu), tungsten (W), cobalt (Co), tantalum (Ta), molybdenum (Mo), and combinations thereof. The back gate contacts 320, 330 can pass through an interlayer dielectric (ILD) layer 400 and first dielectric slab 220 or second dielectric slab 230 to make electrical contact with the first back gate 180 or second back gate 190, respectively.

In various embodiments, the interlayer dielectric (ILD) layer 400 can be made of an insulating dielectric material, including, but not limited to, silicon oxide (SiO), silicon nitride (SiN), silicon oxynitride SiON), high-k dielectric materials having a dielectric constant greater than silicon dioxide ($SiO_2$), low-k dielectric material (e.g., carbon doped silicon oxide (SiO:C)) having a dielectric constant less than silicon dioxide ($SiO_2$), and combinations thereof.

Figure 7:
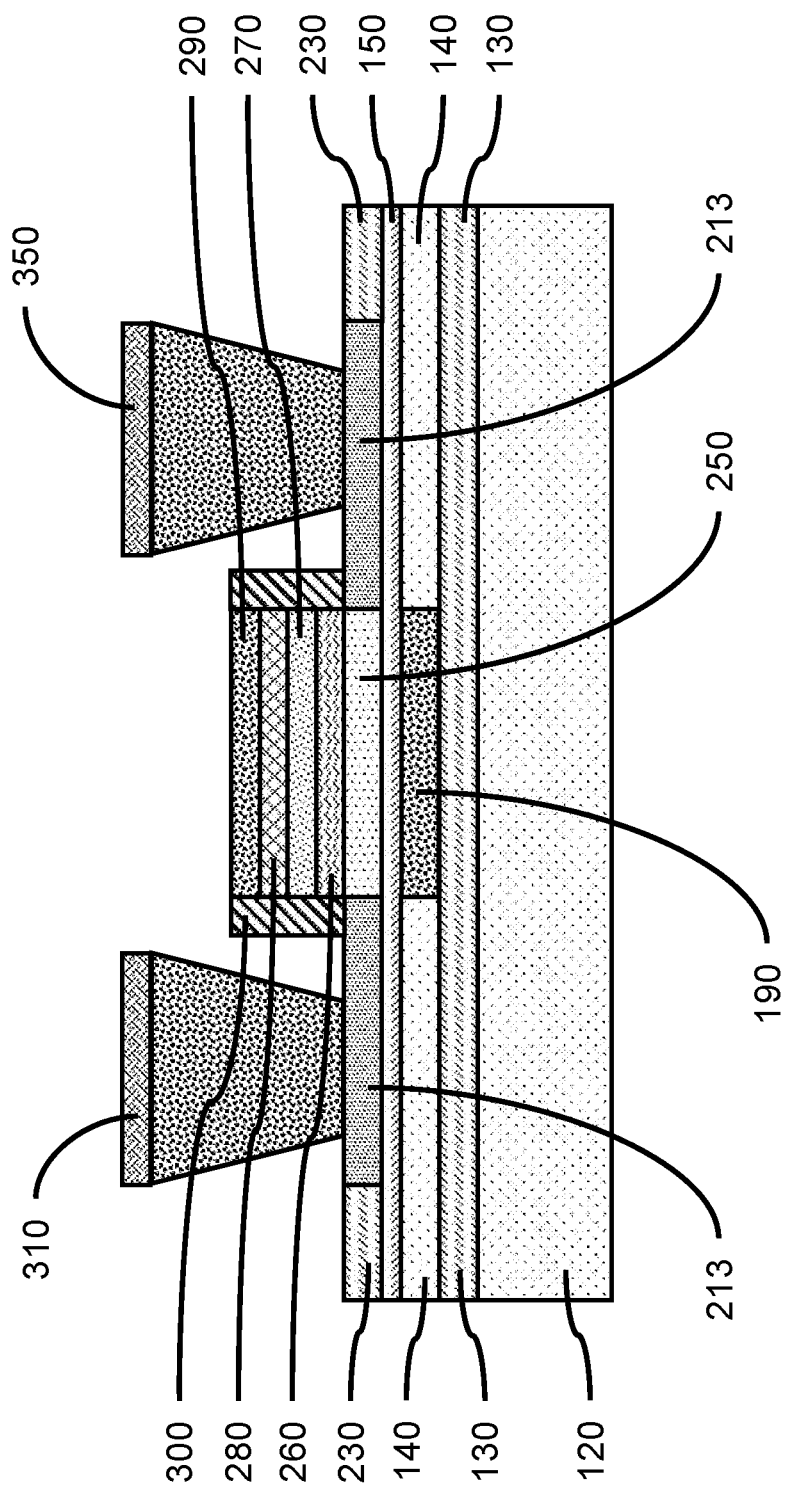
FIG. 7 is a cross-sectional side view along the B-B plane showing the gate structure above the channel region and the back gate below the channel region, in accordance with an embodiment of the present invention.

FIG. 7 is a cross-sectional side view along the B-B plane showing the gate structure above the channel region and the back gate below the channel region, in accordance with an embodiment of the present invention.

In one or more embodiments, the second back gate 190 can be formed within first semiconductor layer 140, where the second back gate 190 is between the first dielectric layer 130 and the second channel region 250. The second back gate 190 can be below the second channel region 250 and between the second source/drains 213. A portion of bridging contact 310 can be on the second source/drains 213 on a first side of the gate structure, and a second source/drain contact 350 can be on the second source/drains 213 on the opposite side of the gate structure.

In one or more embodiments, the metal 290/ferroelectric 280/metal 270/dielectric 260 gate stack can be on the second channel region 250 of a PFET. In various embodiments, portions of the gate sidewall spacer 300 can be on the second source/drains 213.

In various embodiments, second source/drain contact 350 can be formed to a source/drain 213 of the PFET and first source/drain contact 340 can be formed to a source/drain 203 of the NFET.

In one or more embodiments, the first back gate 180 and overlying device components can have the same configuration as shown for the second back gate 190 and overlying device.

In various embodiments, a first source/drain contact 340 can be formed to a first source/drain 203 on one side of the gate structure the NFET.

Figure 8:
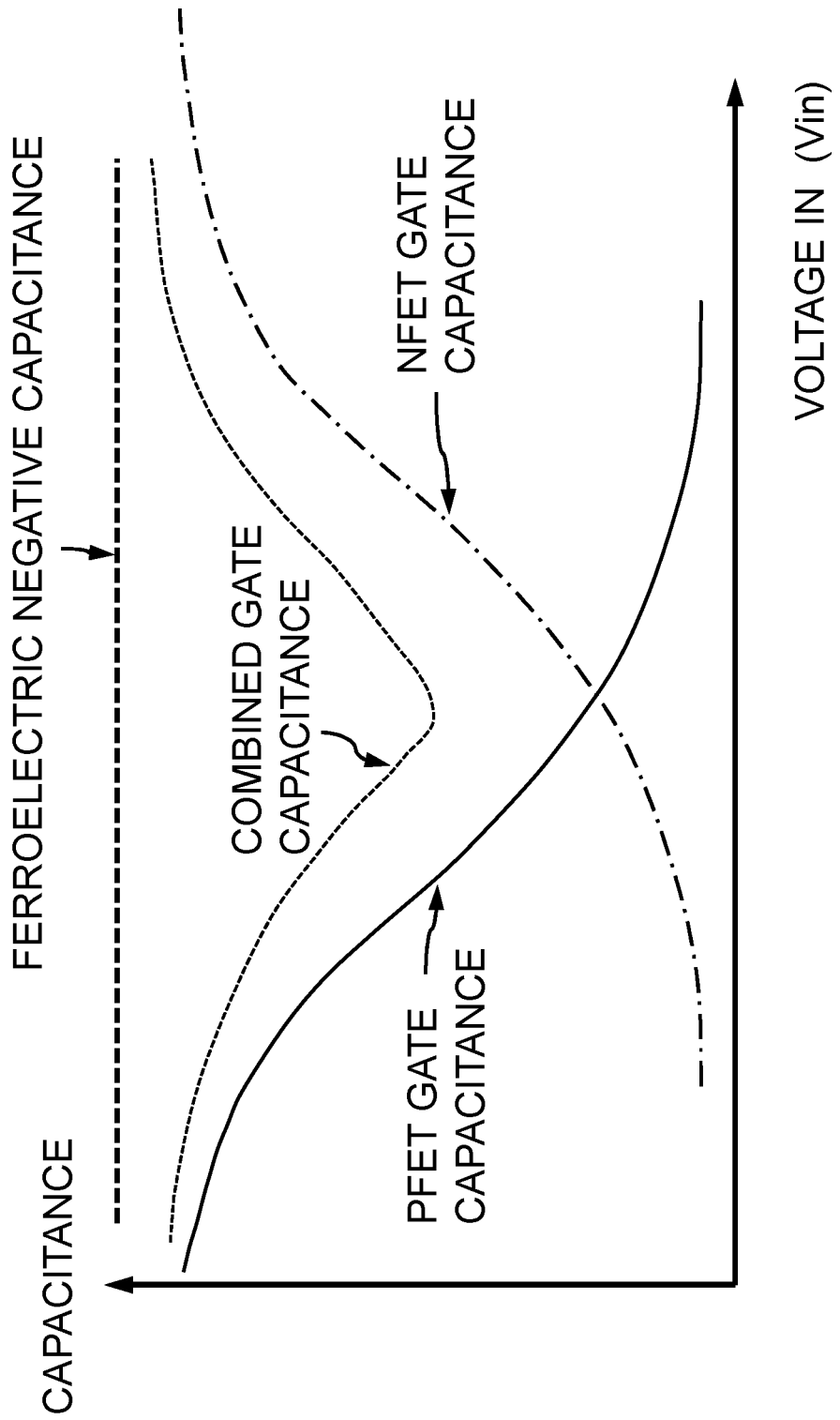
FIG. 8 is a graph illustrating capacitance matching for the combination of the NFET gate capacitance and PFET gate capacitance without $V_t$ correction, where the NFET and PFET share a gate structure, including a work function material, in accordance with an embodiment of the present invention.

FIG. 8 is a graph illustrating capacitance matching for the combination of the NFET gate capacitance and PFET gate capacitance without $V_t$ correction, where the NFET and PFET share a gate structure, including a work function material, in accordance with an embodiment of the present invention.

A ferroelectric capacitor connected with the gate stack of a MOS transistor creates a series connection between $C_{FE}$ and $C_{MOS}$. The negative capacitance of a ferroelectric can be stabilized when placed in-series with a positive capacitor of proper value. To achieve a negative capacitance, the charge line of the baseline transistor has an intersection with the negative slope of the polarization. The negative value of $C_{FE}$ should therefore be well-matched with $C_{MOS}$. This can leverage the parallel complementary FET capacitance to achieve improved $C_{gate}$-to-$C_{FE}$ matching across the full $V_{in}$ sweep range.

FIG. 8 illustrates capacitance matching for the combination of the NFET gate capacitance and PFET gate capacitance without $V_t$ correction (e.g., midgap internal metal gate workfunction~4.6 eV with no backgate bias).

In various embodiments, conductive gate layer 270 is the internal metal gate (IMG), which has a shared work function between both the NFET and PFET. In one or more embodiments, the work function of the conductive gate layer 270 can be selected in combination with other parameters of the NFET and PFET devices to match the capacitance of the ferroelectric layer 280. The selected work function value of the conductive gate layer 270 will result in some separation of the NFET and PFET C-V curves. Capacitance "matching" comes from the dielectric and ferroelectric material and thickness choices. We can supplement this with complementary capacitance matching by reducing the NFET and PFET $V_t$, to flatten out the shared C-V curve. The combined gate capacitance is the sum of the PFET gate capacitance and the NFET gate capacitance. Each of these gate capacitances can be in series with the capacitance of the ferroelectric layer 280.

Figure 9:
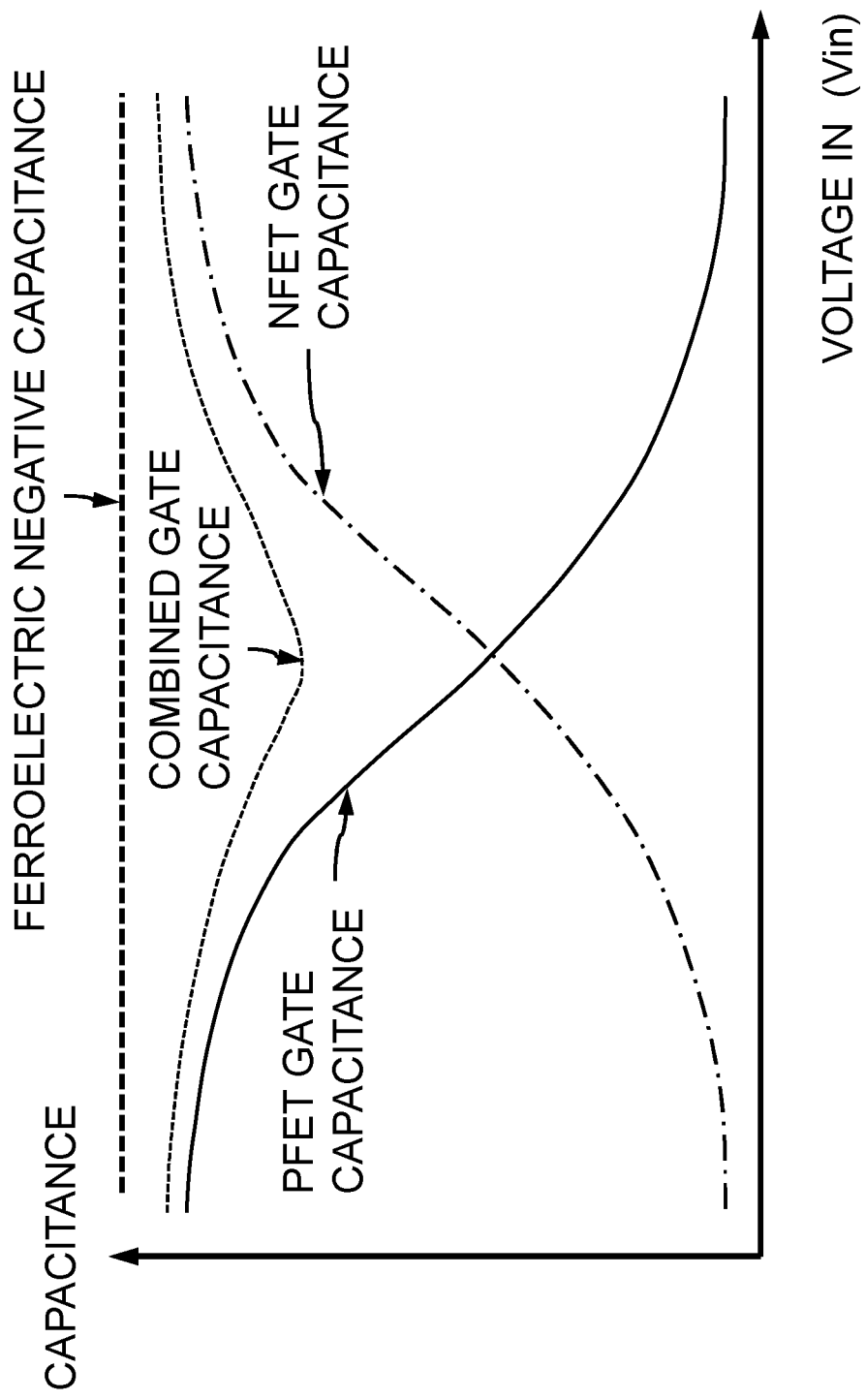
FIG. 9 is a graph illustrating capacitance matching for the combination of the NFET gate capacitance and PFET gate capacitance with an appropriate back gate bias applied, where the NFET and PFET share a gate structure, including a work function material, in accordance with an embodiment of the present invention.

FIG. 9 is a graph illustrating capacitance matching for the combination of the NFET gate capacitance and PFET gate capacitance with an appropriate back gate bias applied, where the NFET and PFET share a gate structure, including a work function material, in accordance with an embodiment of the present invention.

In various embodiments, the first back gate 180 and the second back gate 190 can be used to apply a suitable back gate bias to either or both the NFET and PFET, to flatten out the shared C-V curve by individually tuning the $V_t$'s.

Figure 10:
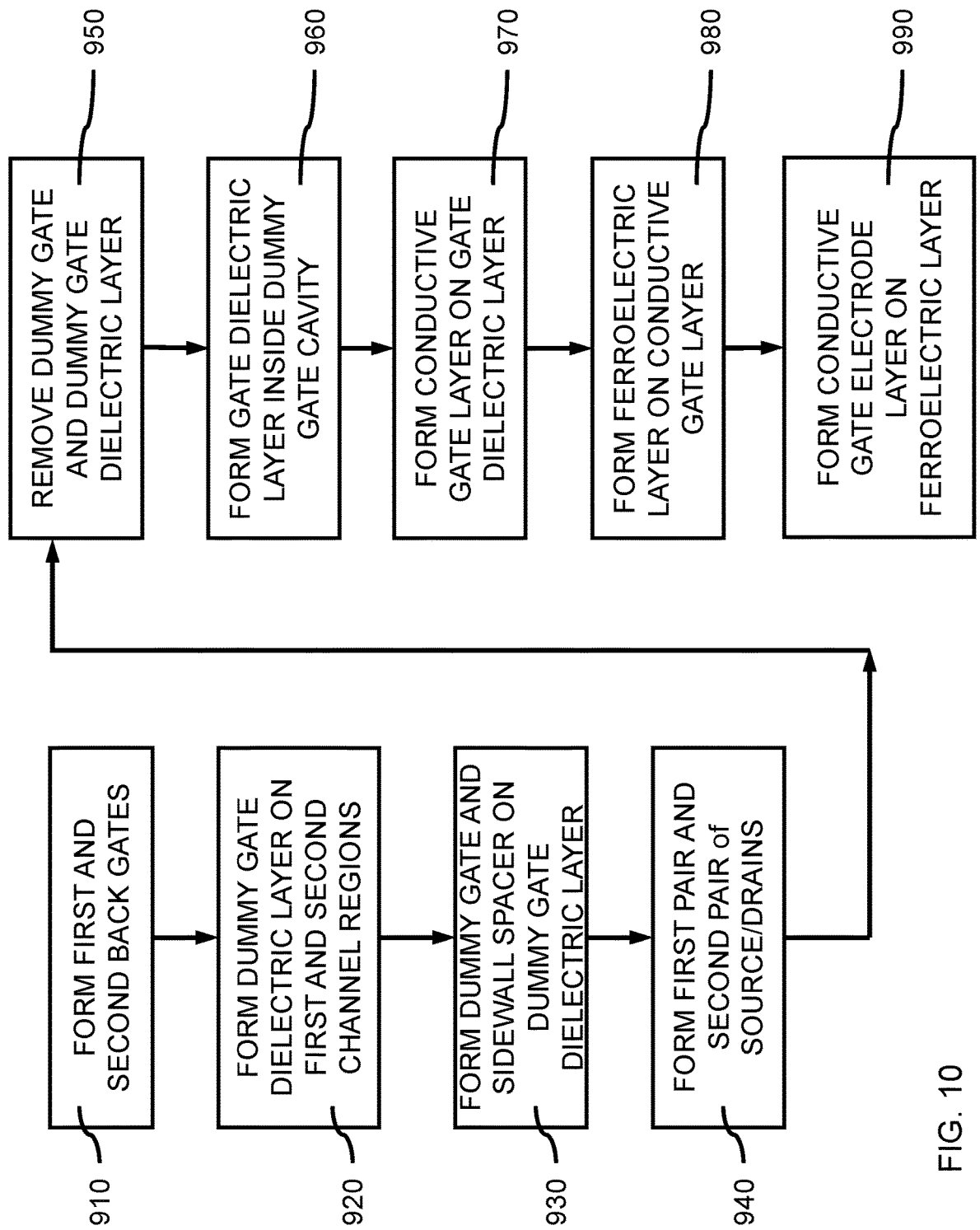
FIG. 10 is a bloc/flow diagram showing a fabrication process for a complementary metal-oxide-semiconductor (CMOS) circuit including an NFET metal-ferroelectric-metal-insulator-semiconductor (MFMIS) negative capacitance field effect transistor device and a PFET metal-ferroelectric-metal-insulator-semiconductor (MFMIS) negative

FIG. 10 is a bloc/flow diagram showing a fabrication process for a complementary metal-oxide-semiconductor (CMOS) circuit including an NFET metal-ferroelectric-metal-insulator-semiconductor (MFMIS) negative capacitance field effect transistor device and a PFET metal-ferroelectric-metal-insulator-semiconductor (MFMIS) negative capacitance field effect transistor device, in accordance with an embodiment of the present invention.

At block 910, the first back gate 180 and the second back gate 190 can be formed in first semiconductor layer 140 and on the first dielectric layer 130. The first back gate 180 and the second back gate 190 can be formed by replacing a portion of the semiconductor layer 140 with a metal or doped semiconductor material.

At block 920, a dummy gate dielectric layer can be formed on the regions of the second semiconductor layer 160 that will become first channel region 240 and/or second channel region 250.

At block 930, a dummy gate and gate sidewall spacer 300 can be formed on the dummy gate dielectric layer.

At block 940, a first pair of source/drains 203 and a second pair of source/drains 213 can be formed in the second semiconductor layer 160 on opposite sides of the dummy gate and sidewall spacer. The first pair of source/drains 203 and the second pair of source/drains 213 can be formed by dopant implantation into regions of the second semiconductor layer 160 on opposite sides of the first channel region 240 and/or second channel region 250.

At block 950, the dummy gate and dummy gate dielectric layer can be removed using selective etch(es).

At block 960, a gate dielectric layer 260 can be formed on the second semiconductor layer 160 within the gate sidewall spacer 300.

At block 970, a conductive gate layer 270 can be formed on the gate dielectric layer 260 within the gate sidewall spacer 300.

At block 980, a ferroelectric layer 280 can be formed on the conductive gate layer 270.

At block 990, a conductive gate electrode layer 290 can be formed on the ferroelectric layer 280.

An ILD layer 400 can be formed on the surfaces of the features formed on the substrate.

In various embodiments, a bridging contact 310, first back gate contact 320, second back gate contact 330, first source/drain contact 340, second source/drain contact 350, and gate contact can be formed in the ILD layer to the respective device features.

One could use a "gate first" process flow to make the final structure as well.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes SixGe1−x where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A complementary metal-oxide-semiconductor (CMOS) circuit, comprising:
    an isolation region on a support substrate that separates a first back gate from a second back gate;
    a gate dielectric layer on a first channel region and a second channel region;
    a shared conductive gate layer having a work function value on the gate dielectric layer over the first channel region and the second channel region; and
    a shared ferroelectric layer on the gate dielectric layer, wherein the first back gate can adjust a threshold voltage for the first channel region, and the second back gate can adjust a threshold voltage for the second channel region.

2. The circuit of claim 1, further comprising a first dielectric layer between the support substrate and the first back gate and between the support substrate and the second back gate.

3. The circuit of claim 1, further comprising a first pair of source/drains on opposite sides of the first channel region.

4. The circuit of claim 3, further comprising a second pair of source/drains on opposite sides of the second channel region.

5. The circuit of claim 4, wherein the first pair of source/drains are n-doped, and the second pair of source/drains are p-doped.

6. The circuit of claim 5, wherein the conductive gate layer has a predetermined work function value in a range of about 4.3 to about 4.9 eV.

7. The circuit of claim 1, wherein the ferroelectric layer is a ferroelectric material selected from the group consisting of hafnium oxide (HfO), zirconium oxide (ZrO), hafnium zirconium oxide (HZO), hafnium silicon oxide (HfSiO$_x$), barium titanate (BaTiO), potassium niobate (KNbO), bismuth titanate (BiTiO), and combinations thereof.

8. The circuit of claim 7, further comprising a bridging contact on one of the first pair of source/drains on opposite sides of the first channel region and on one of the second pair of source/drains on opposite sides of the second channel region, wherein the bridging contact forms an electrical connection between the one of the first pair of source/drains and the one of the second pair of source/drains to form the complementary metal oxide semiconductor (CMOS) circuit.

9. A complementary metal-oxide-semiconductor (CMOS) circuit, comprising:
a first dielectric layer between a support substrate and a first back gate;
a gate dielectric layer on a first channel region over the first back gate and a second channel region;
a first pair of source/drains on opposite sides of the first channel region;
a shared conductive gate layer having a work function value on the gate dielectric layer over the first channel region and the second channel region; and
a shared ferroelectric layer on the conductive gate layer, wherein the first back gate can adjust a threshold voltage for the first channel region.

10. The circuit of claim 9, further comprising a second back gate on the first dielectric layer, with the second channel region over the second back gate, wherein the second back gate can adjust a threshold voltage for the second channel region.

11. The circuit of claim 10, further comprising a second pair of source/drains on opposite sides of the second channel region, wherein the first pair of source/drains are n-doped, and the second pair of source/drains are p-doped.

12. The circuit of claim 11, further comprising an isolation region on the support substrate that separates the first back gate from the second back gate and separates the first channel region from the second channel region.

13. The circuit of claim 12, wherein the gate dielectric layer is across a top surface of the isolation region.

14. The circuit of claim 13, wherein the conductive gate layer has a predetermined work function value in a range of about 4.3 to about 4.9 eV on both the first channel region and the second channel region.

15. The circuit of claim 13, further comprising a bridging contact on one of the first pair of source/drains on opposite sides of the first channel region and on one of the second pair of source/drains on opposite sides of the second channel region, wherein the bridging contact forms an electrical connection between the one of the first pair of source/drains and the one of the second pair of source/drains to form the complementary metal oxide semiconductor (CMOS) circuit.

16. A method of fabricating a field effect transistor (FET) device, comprising:
forming a first back gate and a second back gate between a first dielectric layer and a second dielectric layer on a support substrate;
forming a first pair of source/drains on opposite sides of a first channel region, wherein the first channel region is above the first back gate;
forming a second pair of source/drains on opposite sides of a second channel region, wherein the second channel region is above the second back gate;
forming a gate dielectric layer on the first channel region and the second channel region;
forming a conductive gate layer having a work function value on the gate dielectric layer; and
forming a ferroelectric layer on the conductive gate layer.

17. The method of claim 16, further comprising forming a conductive gate electrode layer on the ferroelectric layer, wherein the ferroelectric layer has a range of negative capacitance.

18. The method of claim 17, wherein the conductive gate layer is a work function material selected from the group consisting of titanium (Ti), tantalum (Ta), tungsten (W), cobalt (Co), molybdenum (Mo), titanium aluminum (TiAl), titanium nitride (TiN), titanium carbide (TiC), tantalum nitride (TaN), tantalum carbide (TaC), tungsten nitride (WN), titanium aluminum nitride (TiAlN), and combinations thereof.

19. The method of claim 16, further comprising forming a first back gate contact to the first back gate and a second back gate contact to the second back gate.

20. The method of claim 19, further comprising forming a bridging contact on one of the first pair of source/drains on opposite sides of the first channel region and on one of the second pair of source/drains on opposite sides of the second channel region, wherein the bridging contact forms an electrical connection between the one of the first pair of source/drains and the one of the second pair of source/drains to form the complementary metal oxide semiconductor (CMOS) circuit.

* * * * *